(12) United States Patent
Louco

(10) Patent No.: US 11,889,614 B2
(45) Date of Patent: Jan. 30, 2024

(54) COOLING CONDUIT FOR ELECTRICAL COMPONENTS ON A PCB

(71) Applicant: BorgWarner Inc., Auburn Hills, MI (US)

(72) Inventor: Lathom Alexander Louco, Arden, NC (US)

(73) Assignee: BORGWARNER INC., Auburn Hills, MI (US)

( * ) Notice: Subject to any disclaimer, the term of this patent is extended or adjusted under 35 U.S.C. 154(b) by 172 days.

(21) Appl. No.: 17/382,526

(22) Filed: Jul. 22, 2021

(65) Prior Publication Data

US 2023/0028967 A1    Jan. 26, 2023

(51) Int. Cl.
  *H05K 1/02*    (2006.01)
  *H05K 7/20*    (2006.01)
  *H05K 5/00*    (2006.01)

(52) U.S. Cl.
  CPC ........... *H05K 1/0209* (2013.01); *H05K 5/003* (2013.01); *H05K 7/20845* (2013.01); *H05K 2201/042* (2013.01); *H05K 2201/10166* (2013.01); *H05K 2201/10212* (2013.01)

(58) Field of Classification Search
  CPC ...... H05K 1/02; H05K 1/0204; H05K 1/0209; H05K 1/0207; H05K 1/181; H05K 7/1432; H05K 7/1488; H05K 7/20218; H05K 7/20254–20263; H05K 7/20272; H05K 7/2039; H05K 7/208845; H05K 7/209; H05K 7/20927–20936; H05K 7/20445; H05K 7/20509; H05K 7/20954; H05K 2201/042; H05K 2201/064; H05K 2201/066; H05K 2201/10166; H05K 2201/10212; H01L 23/4006; H01L 23/3672; H01L 23/3735; H01L 23/427; H01L 23/473

See application file for complete search history.

(56) References Cited

U.S. PATENT DOCUMENTS

| | | | | |
|---|---|---|---|---|
| 4,712,158 A | * | 12/1987 | Kikuchi | H01L 23/4332 |
| | | | | 257/E23.091 |
| 5,731,954 A | * | 3/1998 | Cheon | G06F 1/20 |
| | | | | 174/15.1 |
| 2002/0117291 A1 | * | 8/2002 | Cheon | G06F 1/20 |
| | | | | 165/80.4 |

(Continued)

FOREIGN PATENT DOCUMENTS

GB    2497638 A  *  6/2013  ............... G06F 1/20

OTHER PUBLICATIONS

GB-2497638-A English Translation (Year: 2013).*

*Primary Examiner* — Amir A Jalali
(74) *Attorney, Agent, or Firm* — REISING ETHINGTON P.C.

(57) ABSTRACT

An electronics assembly used in a vehicle included a printed circuit board (PCB) having a first side and a second side; a plurality of electrical components mounted on the first side of the PCB; a heat sink, configured to receive cooling fluid from a source, positioned adjacent to the second side of the PCB; and a cooling fluid conduit, configured to communicate the cooling fluid from a fluid inlet to a fluid outlet, wherein the cooling fluid conduit is positioned adjacent to the first side of the PCB and directly contacts an outer surface of the electrical components.

6 Claims, 5 Drawing Sheets

(56) References Cited

U.S. PATENT DOCUMENTS

| | | | |
|---|---|---|---|
| 2004/0099407 A1* | 5/2004 | Parish, IV | H01L 23/467 257/E23.099 |
| 2008/0160246 A1* | 7/2008 | Buhler | H01L 23/3735 427/97.1 |
| 2009/0096086 A1* | 4/2009 | Natarajan | H01L 23/367 257/E23.098 |
| 2012/0300402 A1* | 11/2012 | Vos | H01L 23/473 165/104.33 |
| 2013/0147503 A1* | 6/2013 | Kamath | G06F 1/20 361/679.53 |
| 2016/0183407 A1* | 6/2016 | Katsumata | H05K 1/181 361/699 |
| 2018/0058777 A1* | 3/2018 | Anderson | F28D 15/00 |
| 2020/0003648 A1* | 1/2020 | Le Henaff | G01L 13/00 |
| 2020/0231023 A1* | 7/2020 | Sathasivam | H01M 10/633 |
| 2020/0329591 A1* | 10/2020 | Battiston | H05K 7/20909 |

* cited by examiner

COOLING CONDUIT FOR ELECTRICAL COMPONENTS ON A PCB

TECHNICAL FIELD

The present application relates to electrical components mounted on printed circuit boards (PCBs) and, more particularly, to cooling conduits that cool electrical components on the PCBs.

BACKGROUND

Internal combustion engines (ICEs) rely on the combination of fuel, spark, and an intake of ambient air to create a combustion event that repeatedly moves pistons in a way to forcibly rotate a crankshaft. Fuel and spark are introduced into a combustion chamber at one end of a cylinder within which the piston moves reciprocatively. As fuel and spark are delivered to the combustion chamber in the presence of ambient air, combustion occurs and forces the piston away from the combustion chamber thereby converting that force into rotational energy through the crankshaft. The power of an ICE can be increased for a given quantity of fuel and spark using the forced induction of ambient air into the combustion chambers via turbochargers as is known. In the past, turbochargers included an exhaust turbine and compressor turbine that were mechanically linked via a common shaft. Turbochargers receive exhaust gas from the ICE that rotates the exhaust turbine, which transmits that rotation to the compression turbine compressing air ultimately introduced to the intake of the ICE.

Turbochargers compress air that is introduced into the intake of the ICE, but effective levels of compressed air may only be generated at higher revolution-per-minute (RPM) levels of crankshaft rotation. It would be helpful to introduce compressed air into the intake of the ICE even when the ICE is operating at relatively low RPM levels. Turbochargers can be equipped with electric motors that are coupled to the compressor turbine and are able to rotate the turbine across a range of throttle positions for the ICE—even at lower RPM levels. However, the inclusion of electric motors with a turbocharger involves additional challenges that may not exist for non-electrically-actuated turbochargers. For example, the electric motors can be controlled by electrical components that are sensitive to heat. Yet turbochargers often operate in a high-temperature environment. Moving the electrical components away from the turbocharger and connecting them to the electrical motor can help keep them cool but this can increase cost and complexity. Keeping the electrical components simultaneously cool and nearby the turbocharger can be challenging.

SUMMARY

In one implementation, an electronics assembly used in a vehicle included a printed circuit board (PCB) having a first side and a second side; a plurality of electrical components mounted on the first side of the PCB; a heat sink, configured to receive cooling fluid from a source, positioned adjacent to the second side of the PCB; and a cooling fluid conduit, configured to communicate the cooling fluid from a fluid inlet to a fluid outlet, wherein the cooling fluid conduit is positioned adjacent to the first side of the PCB and directly contacts an outer surface of the electrical components.

In another implementation, an electronics assembly used in a vehicle includes a printed circuit board (PCB) having a first side and a second side; a PCB housing enclosed around the PCB; a plurality of electrical components mounted on the first side of the PCB; a heat sink, configured to receive cooling fluid from a source, attached to an outer surface of the PCB housing; and a cooling fluid conduit configured to communicate the cooling fluid from a fluid inlet to a fluid outlet and extending within the PCB housing, wherein the cooling fluid conduit is positioned adjacent to the first side of the PCB and directly contacts an outer surface of the electrical components.

In yet another implementation, an electronics assembly used in a vehicle, includes a first printed circuit board (PCB) having a first side and a second side; a second PCB having a first side and a second side; a PCB housing enclosed around the first PCB and the second PCB; a plurality of electrical components mounted on the first side of the first PCB; a plurality of electrical components mounted on the first side of the second PCB; a heat sink, configured to receive cooling fluid from a source, attached to an outer surface of the PCB housing; and a cooling fluid conduit configured to communicate the cooling fluid from a fluid inlet to a fluid outlet and extending within the PCB housing and in between the first PCB and the second PCB, wherein the cooling fluid conduit directly contacts an outer surface of the electrical components mounted on the first PCB or the second PCB.

DETAILED DESCRIPTION

An electronics assembly used in a vehicle can be cooled using cooling fluid circulated by a vehicle. The electronics assembly may include one or more printed circuit boards (PCBs) having electrical components that power and/or control an electric motor used by a vehicle, such as an electrically-actuated turbocharger. A first PCB side can abut a heat sink that is cooled with cooling fluid. Electrical components can be mounted on a second PCB side. A cooling fluid conduit can be positioned adjacent the second PCB side and configured to directly abut an outer surface of the electrical components mounted on the second side. It should be appreciated that the cooling fluid conduit can "directly" contact an outer surface of the electrical components through a thin thermally conductive yet electrically insulating layer. The cooling fluid conduit can be shaped in a variety of forms, beginning at or near one edge of the second PCB side, extending across the second PCB side so that the conduit abuts and carries cooling fluid across an outer surface of electrical components and ending at or nearer another edge of the PCB side. The cooling fluid conduit can be shaped in a variety of ways and extend serpentine across the second PCB side. It should be appreciated that the contoured cooling conduit can be shaped in any one of a variety of ways so that it touches the outside surface of electrical components and the shape can be defined by the location of the electrical components on a side of the PCB.

In some implementations, the electronics assembly can include two PCBs—a first PCB that includes electrical components that regulate power supplied to the electrically-actuated turbocharger and a second PCB that includes electrical components that control the electrical components on the first PCB. The first PCB and the second PCB can be stacked relative to each other with the contoured cooling conduit sandwiched between the PCBs to abut electrical components mounted to the first PCB as well as electrical components mounted on the second PCB.

Figure 1:
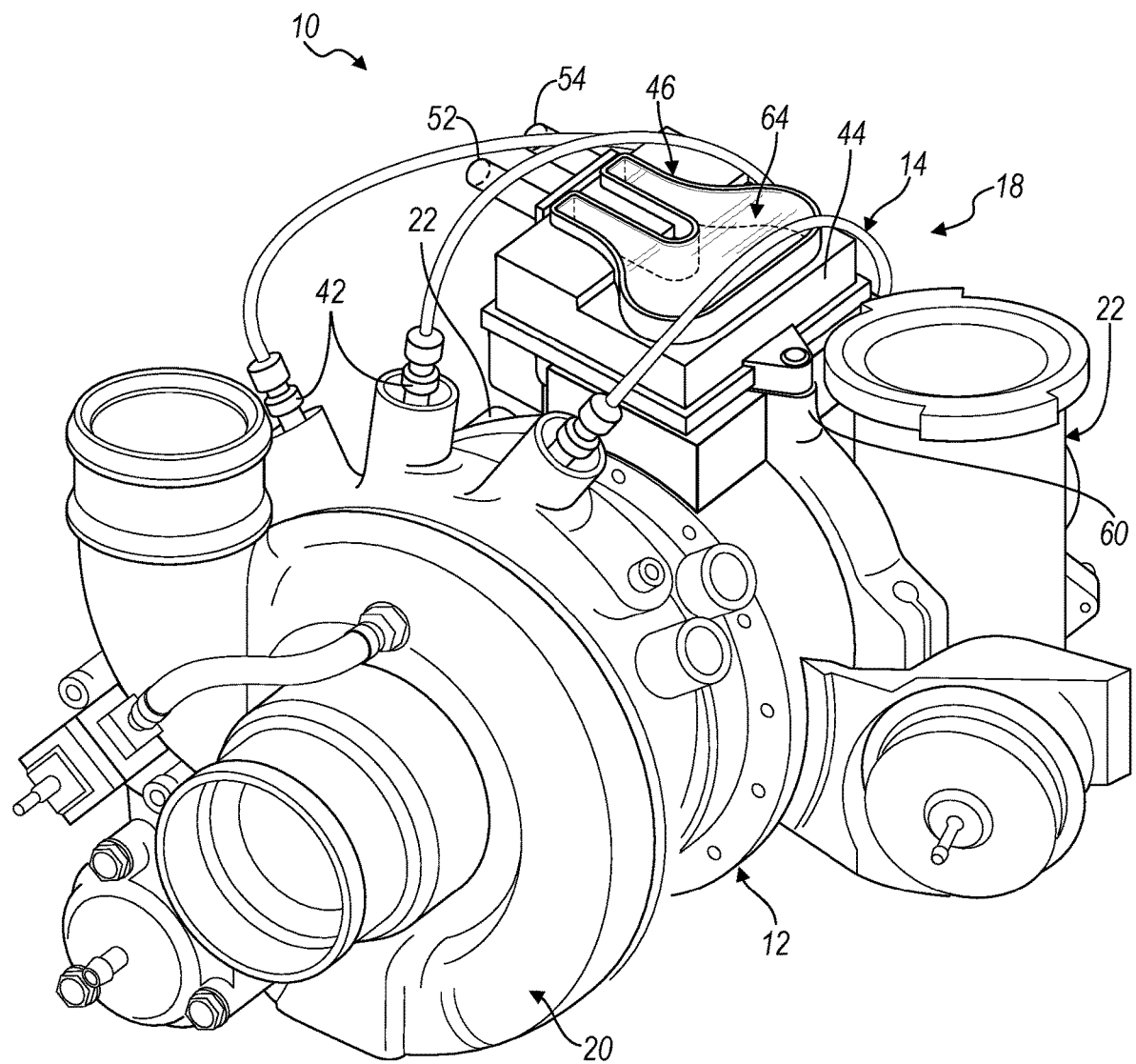
FIG. 1 is a perspective view depicting an implementation of an electrically-actuated turbocharger.
Figure 2:
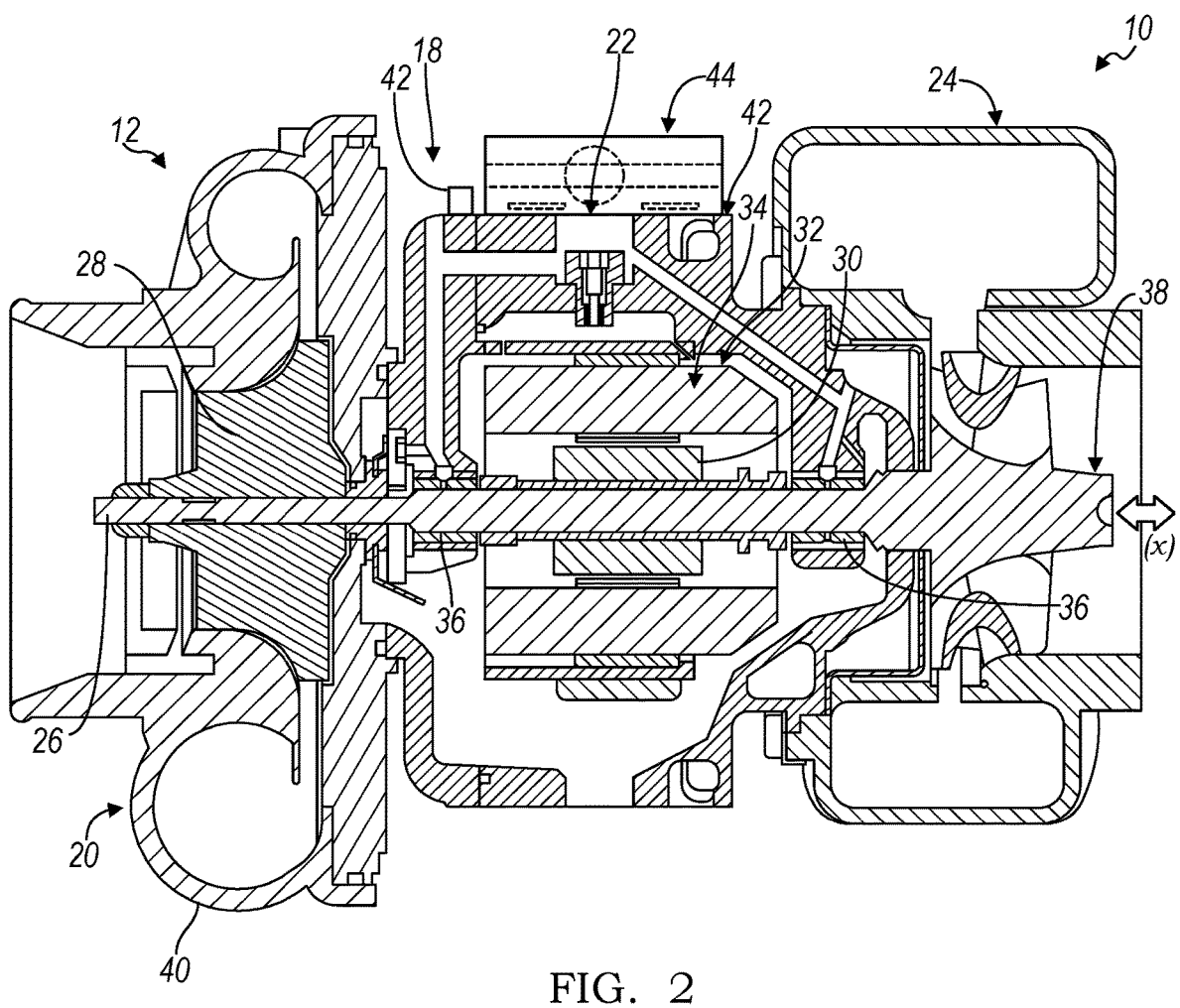
FIG. 2 is a cross-sectional view depicting an implementation of an electrically-actuated turbocharger.

FIGS. 1-2 depict one implementation of an electrically-actuated turbocharger assembly 10 that includes an electrically-actuated turbocharger 12 and an electronics assembly 14 that includes a PCB 16 (shown in FIG. 4) carried by a turbocharger housing 18. The electrically-actuated turbocharger 12 includes a compressor portion 20, an electric motor portion 22, and an exhaust portion 24 that are assembled to form a structure that receives the components of the turbocharger 12. A turbine shaft 26 extends through the compressor portion 20, the electric motor portion 22, and the exhaust portion 24 as can be appreciated in FIG. 2. At one end, the turbine shaft 26 couples with a compressor 28, located in the compressor portion 20, that spins to compress air, which is ultimately supplied to an intake plenum (not shown) of an internal combustion engine (ICE). Another portion of the turbine shaft 26 that is axially-spaced from the compressor 28 and located in the electric motor portion 22 couples with a rotor assembly 30 of an electric motor 32. The rotor assembly 30 can be positioned concentrically relative to a stator 34 included in the electric motor portion 22. One or more bearings 36 are included in the electric motor portion 22 and axially spaced along the turbine shaft 26 to support and stabilize the turbine shaft 26, the compressor 28, the rotor assembly 30, and an exhaust turbine 38 as these elements rotate within the turbocharger 12 during operation. The exhaust turbine 38 is coupled to an end of the turbine shaft 26 distal to the compressor 28 located in the exhaust portion 24.

The compressor portion 20 includes a compressor chamber 40 in which the compressor 28 spins in response to the rotation of the turbine shaft 26 and compresses air that is ultimately supplied to the intake manifold of the ICE. The compressor 28 is coupled with the turbine shaft 26 that extends from the compressor portion 20 into the electric motor portion 22 and the exhaust portion 24. The rotor assembly 30 is coupled to the turbine shaft 26 so that the rotor assembly 30 and the turbine shaft 26 are not angularly displaced relative to each other. When combined, the rotor assembly 30 extends axially relative to the shaft 24 in close proximity to the stator 34. The stator 34 can include a plurality of windings that convey electrical current from the power electronics and induce the angular displacement of the rotor assembly 30 and the turbine shaft 26 coupled to the rotor assembly 30 relative to the stator 34. The compressor chamber 40 is in fluid communication with a compressor inlet that draws air from the surrounding atmosphere and supplies it to the compressor 26. As the PCB selectively provides current to the windings of the stator 34, the rotor 30 is induced to rotate and impart that rotation on the turbine shaft 26 and the compressor 28.

In one implementation, the stator 34 and the rotor 30 can be implemented as a direct current (DC) brushless motor that receives DC voltage from a vehicle battery (not shown). The amount of DC voltage applied to the stator 34 may be greater than 40 volts (V), such as can be provided by a modern 48V vehicle electrical system. Other implementations are possible in which a vehicle electrical system uses higher voltages, such as 400V and 800V. Electrical connectors 42 are included on the electrically actuated turbocharger 12 and communicate electrical power from an electrical source to the turbocharger 12 through the PCB 16 that regulates electrical current supplied to the electrical motor of the electrically-actuated turbocharger 12. A power cable 43 electrically connects the vehicle battery to the PCB 16 and the electrical connectors 42 electrically connect the PCB 16 to the electrically-actuated turbocharger 12.

The exhaust portion 24 is in fluid communication with exhaust gases generated by the ICE. As the revolutions per minute (RPMs) of the crankshaft of the ICE increase, the volume of the exhaust gas generated by the ICE increases and correspondingly increases the pressure of exhaust gas in the exhaust portion 24. This increase in pressure can also increase the angular velocity of the exhaust turbine 38 that communicates rotational motion to the compressor 28 through the turbine shaft 26. In this implementation, the compressor 28 receives rotational force from the exhaust turbine 38 and the electric motor 32. More particularly, when the ICE is operating at a lower RPM, the electric motor 32 can provide rotational force to the compressor 28 even though exhaust gas pressure within the exhaust portion 24 is relatively low. As the ICE increases the RPM of the crankshaft, exhaust gas pressure within the exhaust portion 24 can build and provide the rotational force that drives the compressor 28.

Figure 3:
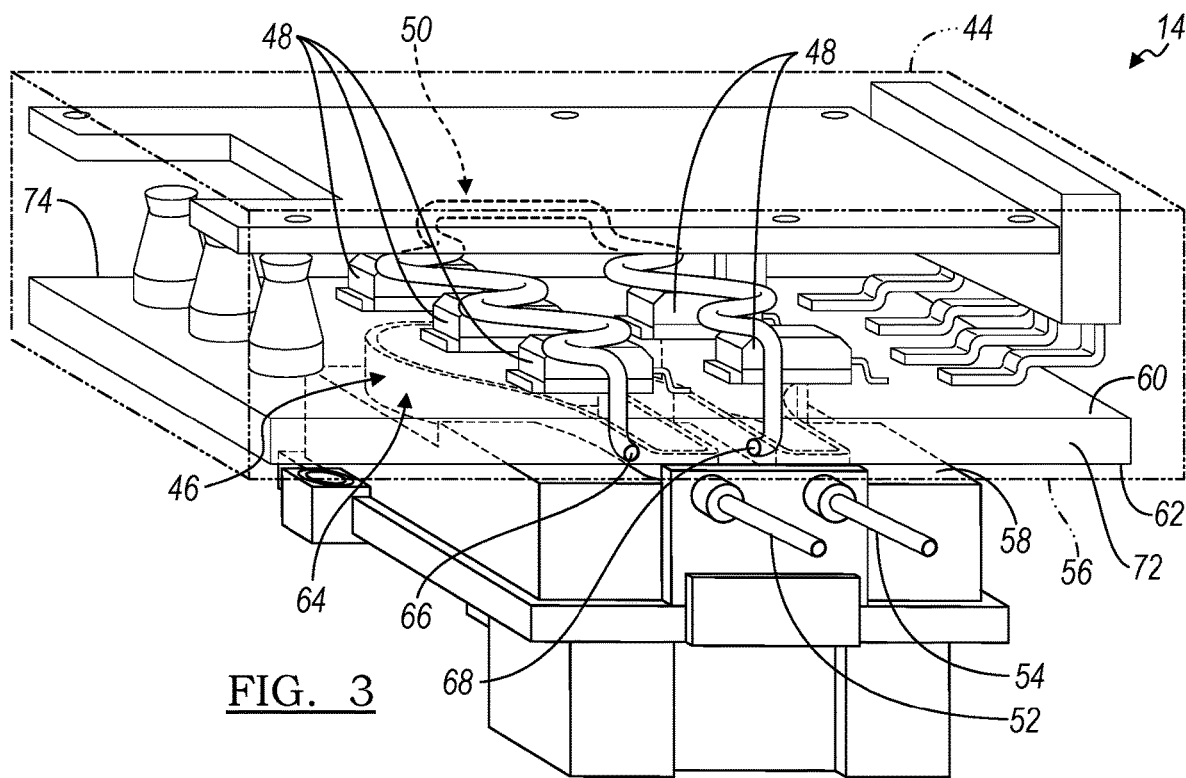
FIG. 3 is a perspective view depicting an implementation of an electronics assembly used in a vehicle.
Figure 5:
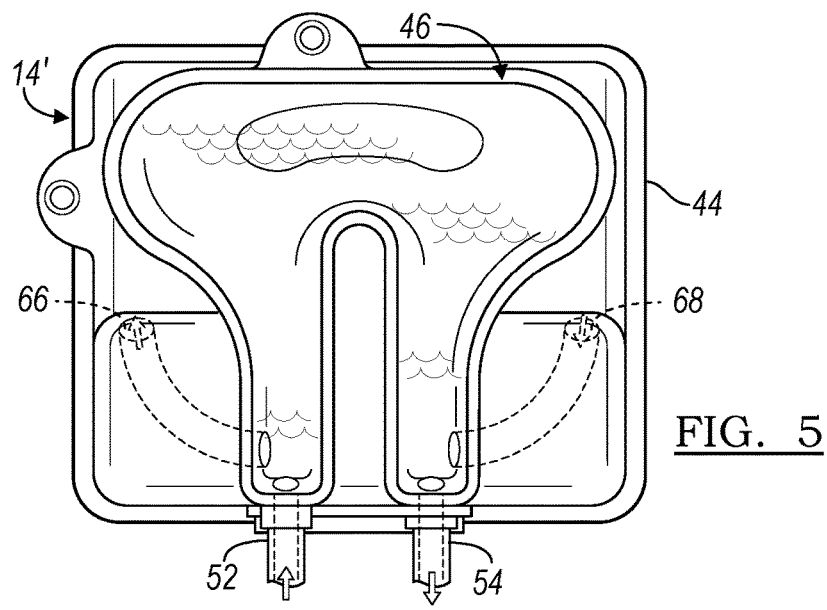
FIG. 5 is a plan view depicting a portion of another implementation of an electronics assembly used in a vehicle.
Figure 6:
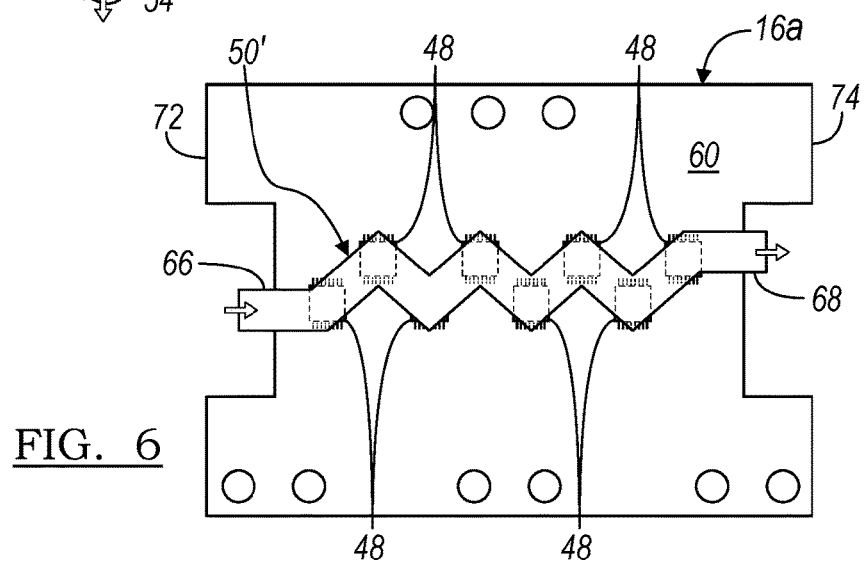
FIG. 6 is a plan view depicting a portion of another implementation of an electronics assembly used in a vehicle.
Figure 7:
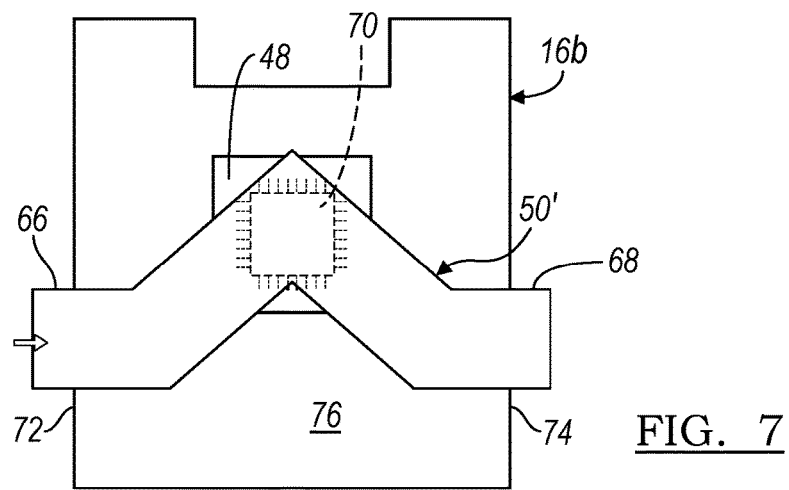
FIG. 7 is a plan view depicting another portion of another implementation of an electronics assembly used in a vehicle.
Figure 8:
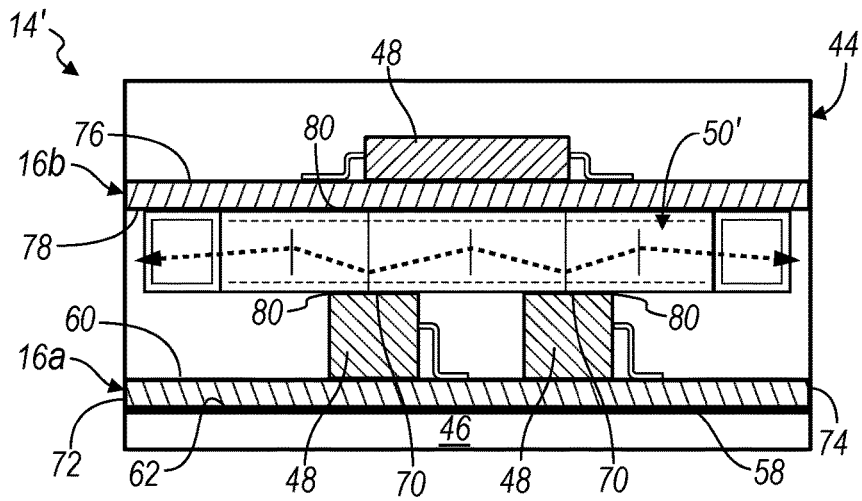
FIG. 8 is a profile view depicting another portion of another implementation of an electronics assembly used in a vehicle.
Figure 9:
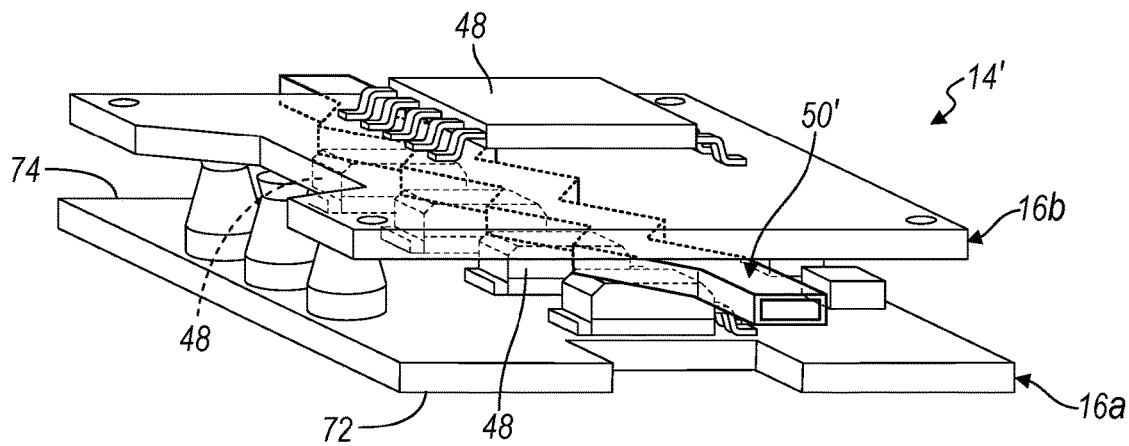
FIG. 9 is a perspective view depicting another portion of another implementation of an electronics assembly used in a vehicle.

The electronics assembly 14 can be coupled to the electrically-actuated turbocharger 12 as is shown in FIGS. 1-2. Implementations of the electronics assembly 14 are shown in FIGS. 3 and 5 and include a PCB housing 44 that receives one or more PCBs 16. The PCB housing 44 can be shaped so that it fits closely with or abuts the electrically-actuated turbocharger 12. A heat sink 46 can be formed on an outer surface of the PCB housing 44. The heat sink 46 includes a heat sink inlet that receives cooling fluid and a heat sink outlet that returns the cooling fluid to a heat exchanger (not shown). In this implementation, the heat sink 46 is formed on an outer surface of the PCB housing 44. However, other implementations are possible in which the heat sink 46 is formed within an outer wall of a PCB housing. An inner surface of the PCB housing is shaped so that it abuts a first PCB surface and the electrical components 48 mounted on the PCB surface at a location adjacent to the heat sink thereby cooling the first PCB.

The PCB 16 can be constructed from a substrate comprising a non-conductive material, such as glass-reinforced epoxy laminate that is commonly referred to as FR4. Conductive layers can be formed within the substrate to form a plurality of electrical circuits. The electrical components 48 may be capacitors, resistors, and/or transistors that are physically mounted on the PCB 16 and include electrical leads that pass through the substrate to electrically connect with the conductive layer. Or, alternatively, the substrate can support one or more vias that extend through the substrate to electrically connect with the conductive layer. The electrical leads of the electrical components 48 can be electrically connected, such as by soldering, to the vias that ultimately communicate electrical current to the conductive layer. The conductive layer can include one or more circuit traces that electrically connect a plurality of the electrical components 48 carried by the PCB 16. In this implementation, the conductive layer comprises bonded copper but other conductive materials could be used instead.

Figure 4:
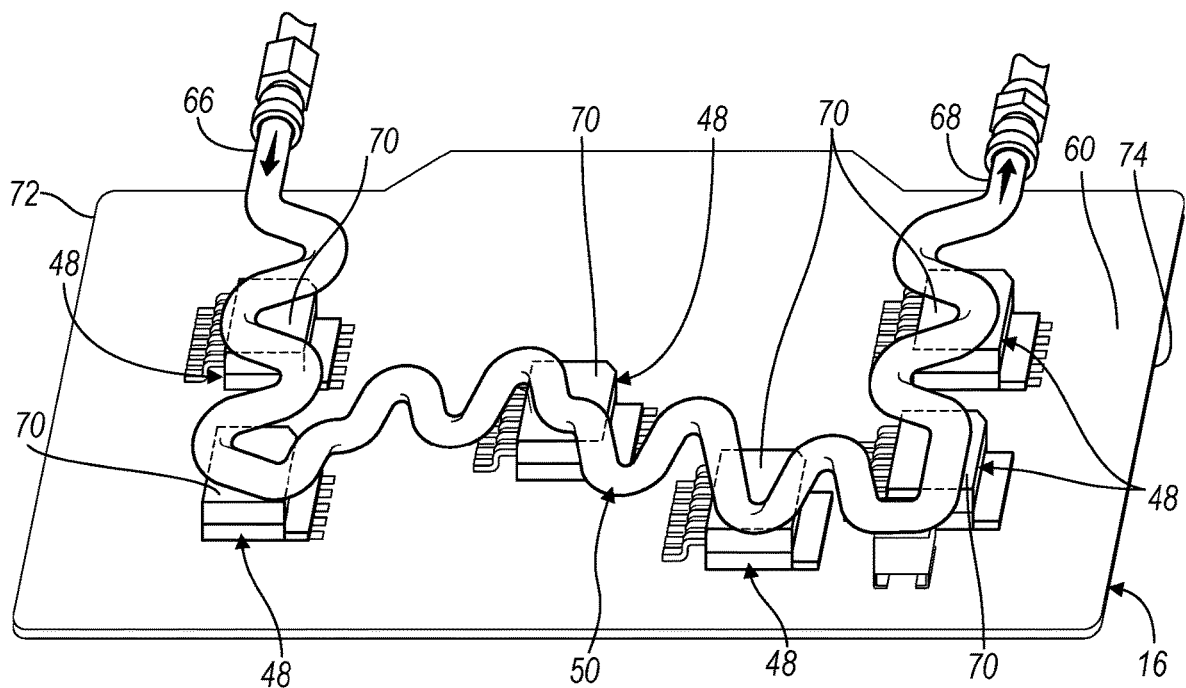
FIG. 4 is a perspective view depicting a portion of an implementation of an electronics assembly used in a vehicle.

Implementations of the electronics assembly 14 and a PCB 16 are shown in FIGS. 3 and 4. The electronics assembly 14 includes the heat sink 46 positioned next to the PCB 16. A plurality of electrical components 48, implemented as MOSFET power transistors, can be mounted to a first side 60 of the PCB 16. The PCB 16 can be positioned in the PCB housing 44 such that a second side 62 of the PCB 16 abuts an inner surface 58 of the PCB housing 44 that is adjacent to the heat sink 46. The heat sink 46 can include a manifold 64 fluidly connected to a fluid inlet 52 and a fluid outlet 54 that collectively receive cooling fluid from a source, such as a heat exchanger or a fan-assisted radiator in a vehicle, pass the fluid through the manifold 64 to cool the PCB 16 and the PCB housing 44, and return fluid from the manifold 64 to the source through the fluid outlet 54. Cooling fluid provided by the cooling supply could be implemented in a variety of ways. In one implementation, an ICE can supply cooling fluid, such as engine oil or engine coolant, to the fluid inlet 52 under pressure generated by an oil pump or water pump. The fluid from the ICE can arrive from an engine oil cooler or radiator that lowers the temperature of the fluid. In one example, the fluid can exist at 100° Celsius (C) while the housing 18 of the electrically-actuated turbocharger may exist at 175° C. so the fluid can lower the temperature level of the PCB housing 44 and the electrical components 48 through the heat sink 46 and a cooling fluid conduit 50. In another implementation, the cooling fluid can be supplied by a dedicated heat exchanger that receives cooling fluid, such as a eutectic solution, at an elevated temperature from the fluid outlet 54, lowers the temperature of the cooling fluid, and then supplies the cooling fluid to the fluid inlet 52.

The cooling fluid conduit 50 can be positioned adjacent the first side 60 of the PCB 16 and shaped so that the conduit 50 abuts a surface 70 of the electrical components 48. The cooling fluid conduit 50 can receive cooling fluid from the fluid source at a conduit inlet 66 and communicate the fluid through the conduit 50 across the surfaces 70 of each electrical component 48. The cooling fluid passing through the heat sink 46 and the cooling fluid conduit 50 can collectively provide a cooling effect to the PCB 16 and the electrical components 48 from opposite sides of the PCB 16, and also near the external surface 56 of the PCB housing 44 and within the PCB housing 44. The conduit inlet 66 can be in fluid communication with the fluid inlet 52 that provides cooling fluid to the heat sink 46 while the conduit outlet 68 can be in fluid communication with the fluid outlet 54 that carries cooling fluid away from the heat sink 46 to the fluid source.

The cooling fluid conduit 50 can be formed in a variety of cross-sectional shapes and from a variety of materials. The materials can be chosen for their ability to conduct heat. For example, the cooling fluid conduit 50 can be hydroformed tubing made of copper. Or in another example, the cooling fluid conduit could be cast from aluminum. A serpentine shape, or contour, of the cooling fluid conduit 50 can be implemented and determined based on the location of the electrical components 48 on the PCB 16; the shape can ensure that the conduit 50 abuts the surface 70 of the electrical components 48. The shape of the cooling fluid conduit 50 can extend from a location near an edge 72 of the PCB 16 to another location near another edge 74 of the PCB 16. In some implementations, the cooling fluid conduit can extend in a straight line across the PCB. The cooling fluid conduit can have a relatively square or rectangular cross-sectional shape that can have a width substantially covering an outer surface of the electrical components.

Another implementation of the electronics assembly 14' is shown in FIGS. 5-9. The assembly 14' includes a first PCB 16a, a second PCB 16b, the PCB housing 44, the heat sink 46, and a cooling fluid conduit 50'. The first PCB 16a and the second PCB 16b can be stacked on top of each other inside of the PCB housing 44. The first PCB 16a can have a plurality of electrical components 48, implemented as MOSFET power transistors, attached to a first side 60 of the PCB 16a. The second side 62 of the first PCB 16a can abut an inner surface 58 of the PCB housing 44 that is adjacent to the heat sink 46. The cooling fluid conduit 50' can be positioned adjacent the first side 60 of the first PCB 16a and shaped so that the conduit 50' abuts a surface 70 of the electrical components 48 via a thermal insulating layer (TIM) 80. In this implementation, the cooling fluid conduit 50' extends from one edge 72 of the PCB 16a toward another edge 74 alternating direction in a zig-zagging path to abut the electrical components 48. The cooling fluid conduit 50' can have a square or rectangular cross-sectional shape and be sized to substantially cover the surface 70 of the electrical components 48. By covering the surface 70, the cooling fluid conduit 50' can provide a maximum cooling effect. The second PCB 16b can include an electrical component 48 mounted on a first side 76, implemented as a microcontroller for controlling the power transistors mounted on the first PCB 16a. The second PCB 16b can be placed on top of the first PCB 16a so that the first side 76 of the second PCB 16b faces away from the cooling fluid conduit 50' and a second side 78 of the second PCB 16b abuts the cooling fluid conduit 50'. It should be appreciated that a thermal insulating layer (TIM) 80 can be positioned in between the electrical components 48 and the cooling fluid conduit 50' as the components 48 abut the conduit 50'. The cooling fluid passing through the heat sink 46 and the cooling fluid conduit 50' can collectively provide a cooling effect to the first PCB 16a, the second PCB 16b, and the electrical components 48 on the PCBs 16a, 16b using the heat sink 46 and within the PCB housing 44 using the cooling fluid conduit 50'.

Figure 10:
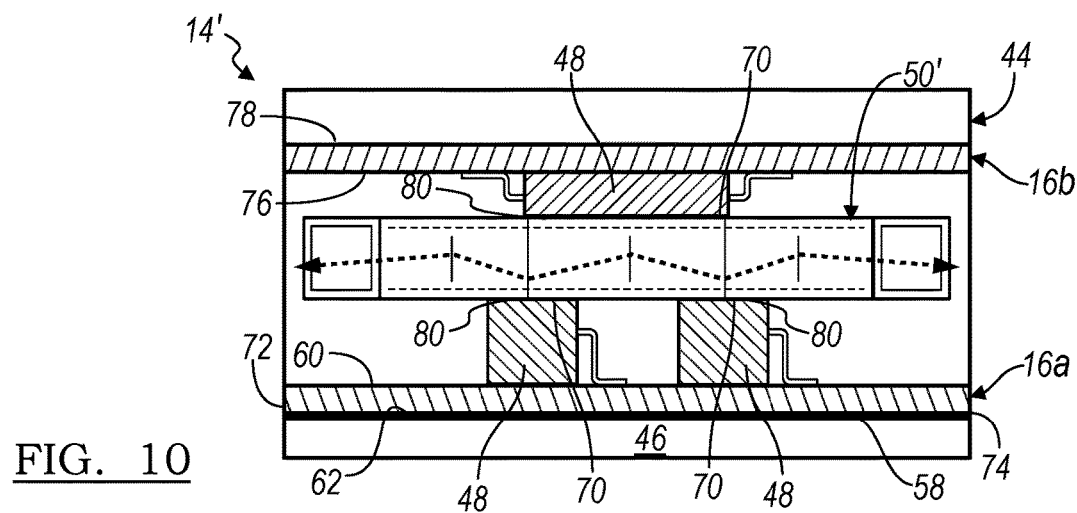
FIG. 10 is a profile view depicting another portion of another implementation of an electronics assembly used in a vehicle.

Other implementations are possible. For example, as shown in FIG. 10, the electronics assembly 14' can be modified so that the first side 76 of the second PCB 16b faces the cooling fluid conduit 50' and the electrical component 48 implemented as the microprocessor controlling the power transistors can abut the conduit 50'. That way, the electrical components 48 on the first PCB 16a and the electrical component 48 on the second PCB 16b each abut the contoured cooling conduit 50'.

It should be appreciated that the concepts described herein can be applied to electrically actuated turbochargers configured in different ways. For example, the electrically actuated turbocharger can be implemented using a compressor portion and an electric motor portion while omitting the exhaust portion. In such an implementation, the turbocharger includes a compressor coupled to the electric motor via a turbine shaft without relying on an exhaust turbine to also be coupled to the turbine shaft. This implementation can sometimes be referred to as an electric supercharger because forced induction in this implementation relies solely on the rotational force provided by an electric motor rather than also using an exhaust turbine that is rotationally driven by exhaust gases. It should also be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. An electronics assembly used in an electrically-actuated turbocharger assembly, comprising:
   a first printed circuit board (PCB) having a first side and a second side;
   a second PCB having a first side and a second side;
   a PCB housing enclosed around the first PCB and the second PCB;
   a plurality of electrical components mounted on the first side of the first PCB;
   a plurality of electrical components mounted on the first side of the second PCB;
   a heat sink, configured to receive cooling fluid from a source within a vehicle, attached to an outer surface of the PCB housing; and
   a cooling fluid conduit configured to communicate the cooling fluid from a fluid inlet to a fluid outlet and extending within the PCB housing and in between the first PCB and the second PCB, wherein the cooling fluid conduit directly contacts an outer surface of the electrical components mounted on the first PCB or the second PCB.

2. The electronics assembly recited in claim 1, wherein the cooling fluid conduit directly contacts an outer surface of the electrical components mounted on the first PCB and the second PCB.

3. The electronics assembly recited in claim 1, wherein the electrical components mounted on the first PCB are power transistors.

4. The electronics assembly recited in claim 1, wherein the electrical components mounted on the second PCB include a microprocessor.

5. The electronics assembly recited in claim 1, wherein the cooling fluid conduit is die-cast metal.

6. The electronics assembly recited in claim 1, wherein the cooling fluid conduit is hydroformed metal.

* * * * *